(12) United States Patent
Tsujimoto et al.

(10) Patent No.: US 8,821,708 B2
(45) Date of Patent: Sep. 2, 2014

(54) METHOD OF SURFACE TREATMENT FOR THE INHIBITION OF WHISKERS

(75) Inventors: Masanobu Tsujimoto, Hirakata (JP); Isamu Yanada, Hirataka (JP); Katsuaki Suganuma, Suita (JP); Keunsoo Kim, Suita (JP)

(73) Assignees: C. Uyemura & Co., Ltd., Osaka (JP); Osaka University, Osaka (JP)

( * ) Notice: Subject to any disclaimer, the term of this patent is extended or adjusted under 35 U.S.C. 154(b) by 1111 days.

(21) Appl. No.: 12/089,025

(22) PCT Filed: Oct. 2, 2006

(86) PCT No.: PCT/JP2006/319668
§ 371 (c)(1),
(2), (4) Date: Apr. 2, 2008

(87) PCT Pub. No.: WO2007/040191
PCT Pub. Date: Apr. 12, 2007

(65) Prior Publication Data
US 2009/0223830 A1 Sep. 10, 2009

(30) Foreign Application Priority Data
Oct. 3, 2005 (JP) ................................. 2005-289493

(51) Int. Cl.
| | | |
|---|---|---|
| *C25D 5/02* | (2006.01) | |
| *C25D 5/00* | (2006.01) | |
| *C25D 5/10* | (2006.01) | |
| *H05K 3/24* | (2006.01) | |
| *C25D 7/00* | (2006.01) | |
| *B32B 15/01* | (2006.01) | |
| *H01R 13/03* | (2006.01) | |

(52) U.S. Cl.
CPC .......... *C25D 5/10* (2013.01); *H05K 2201/0347* (2013.01); *H05K 3/244* (2013.01); *C25D 7/00* (2013.01); *C25D 5/02* (2013.01); *H01R 13/03* (2013.01); *B32B 15/01* (2013.01); *H05K 2201/0769* (2013.01)
USPC ........................................... 205/112; 205/220

(58) Field of Classification Search
USPC .......................................... 205/111, 112, 118
See application file for complete search history.

(56) References Cited

U.S. PATENT DOCUMENTS

| | | | |
|---|---|---|---|
| 5,916,695 A | 6/1999 | Fister et al. | |
| 6,080,504 A * | 6/2000 | Taylor et al. | 429/481 |
| 2002/0185716 A1 | 12/2002 | Abys et al. | |
| 2005/0106408 A1 | 5/2005 | Chen et al. | |

FOREIGN PATENT DOCUMENTS

| | | |
|---|---|---|
| DE | 1771954 B1 | 11/1971 |
| EP | 1241281 A1 | 9/2002 |
| JP | 53-115623 A | 10/1978 |
| JP | 56-47955 B2 | 11/1981 |
| JP | 56-47956 B2 | 11/1981 |
| JP | 59-35694 A | 2/1984 |
| JP | 63-121693 A | 5/1988 |
| JP | 63-285943 A | 11/1988 |
| JP | 09-045579 A | 2/1997 |
| JP | 10-102266 A | 4/1998 |
| JP | 2942476 B2 | 6/1999 |
| JP | 2002-53981 A | 2/2002 |
| JP | 2002-141456 A | 5/2002 |
| JP | 2002-317295 A | 10/2002 |
| JP | 2003-3292 A | 1/2003 |
| JP | 2005-154835 A | 6/2005 |
| JP | 2005154837 A * | 6/2005 |

OTHER PUBLICATIONS

Chinese Office Action dated Dec. 18, 2009, issued in corresponding Chinese Patent Application No. 200680036970.0.
Technical Reports of Mitsubishi Electric Corporation; 1979; vol. 53; No. 11.
International Search Report of PCT/JP2006/319668, date of mailing Dec. 5, 2006.
Japanese Office Action dated Mar. 16, 2011, issued in corresponding Japanese Patent Application No. 2005-289493.
Japanese Office Action dated May 18, 2011, issued in corresponding Japanese Patent Application No. 2005-289493.
Supplementary Partial European Search Report dated Dec. 19, 2011, issued in corresponding European Patent Application No. 06811016.2.

* cited by examiner

*Primary Examiner* — Bryan D. Ripa
(74) *Attorney, Agent, or Firm* — Westerman, Hattori, Daniels & Adrian, LLP

(57) ABSTRACT

A surface treatment method of cladding a Sn or Sn alloy coating with one or more metals selected from among Mn, Fe, Ru, Os, Co, Rh, Ir, Ni, Pd, Pt, Cu, Ag, Au, Zn, Cd, Ga, In, Ti, Ge, Pb, Sb and Bi continuously or discontinuously in such a way as to make the Sn or Sn alloy coating partially exposed, which method makes it possible to inhibit the generation of whiskers in an Sn or Sn alloy coating formed on the surface of a substrate to which other member is pressure-welded or the joint surface to be soldered. Cladding an Sn or Sn alloy coating with a prescribed metal continuously or discontinuously in such a way as to make the coating partially exposed inhibits the generation of whiskers by contact pressure in pressure welding, and further inhibits the generation of whiskers without impairing the solder wettability of the coating even when the cladding is not followed by heat treatment or reflowing.

8 Claims, 2 Drawing Sheets

(A)
 (B)

(A)
 (B)

(A)
 (B)

(A)
 (B)

(A)

(B)

(A)

(B)

METHOD OF SURFACE TREATMENT FOR THE INHIBITION OF WHISKERS

TECHNICAL FIELD

This invention relates to a surface treatment method for effectively inhibiting the generation of whiskers on a Sn or Sn alloy coating formed on a substrate surface to which other member is fixed by pressure welding or on a joint surface to be soldered.

BACKGROUND ART

Sn or Sn alloy coatings such as Sn, Sn—Cu, Sn—Ag, Sn—Bi and the like have been widely used in electronic parts and the like because of their excellent solder wettability. It is known that if these plated coatings have an internal stress therein, a hair-shaped crystal called whisker is liable to occur, with the attendant problem that circuits are short-circuited by the action of the whiskers. A Sn alloy-plated coating has a better effect of inhibiting whisker generation than a Sn-plated coating, but not satisfactory.

In order to inhibit the whisker generation, the following methods (see Technical Reports of Mitsubishi Electric Corporation, 1979, vol. 53, No. 11 (Non-Patent Document 1)) have been hitherto used, but with individual problems.
(1) To carry out Ni plating on a Sn and Sn alloy-plated undercoat: serving as a barrier for the formation of an intermetallic compound between a Cu material and plated Sn thereby inhibiting whisker generation. In this regard, however, there are a number of parts that are unable to be plated with Ni because of the characteristics required therefor and such Ni plating is not effective against contact pressure-induced whiskers generated by the action of an external stress.
(2) To make a thick plated coating of Sn or an Sn alloy plating (10 to 20 μm or over): if the coating is made thick, an influence of an internal stress caused by the formation of an intermetallic compound does not extend over a plated surface layer, thereby inhibiting whisker generation. In this connection, however, there are some types of electronic parts which cannot be applied thereon with a thick coating.
(3) To carry out a thermal treatment after Sn and Sn alloy plating: when the thermal treatment is carried out, an internal stress caused by the formation of an intermetallic compound is mitigated, thereby inhibiting whisker generation. Usually, treated under about 150° C.-one hour. Because of the thermal treatment after plating, this is not effective against contact pressure-induced whiskers applied with an external stress after the thermal treatment.
(4) To carry out reflowing after Sn and Sn alloy plating: an Sn coating is completely melted, for which reflowing is more effective than thermal treatment. However, if a plated coating is thick, a uniform coating cannot be obtained after reflowing. An oxide film is formed on the Sn coating by reflowing, thereby degrading solder wettability. Reflowing is not effective against contact pressure-induced whiskers applied with an external stress after reflowing.

Even with a member that is reduced in internal stress and is unlikely to form whiskers on its own, if a stress is exerted thereon from outside, contact pressure-induced whiskers generate. The contact pressure used herein means an external load exerted on a Sn or Sn alloy coating in case where a flexible substrate formed with the Sn or Sn alloy coating is fitted into a an insertion portion of a contact of electronic parts such as, for example, a connector and the like and also an external load added to a Sn or Sn alloy coating when other member is fixed to the Sn or Sn alloy coating by pressure welding. Contact pressure-induced whiskers are generated on a plated coating of Sn or Sn alloys such as Sn, Sn—Cu, Sn—Ag, Sn—Bi and the like, which is formed as a surface treatment at the fitted portion or pressure-welded portion of electronic parts.

As a method for preventing contact pressure-induced whiskers from occurring, mention is made of a method of inhibiting contact pressure-induced whiskers from being generated by carrying out a thermal treatment under conditions of an external pressure being imposed thereon such as after fitting, thereby mitigating a stress caused by the external pressure (Japanese Patent Laid-Open No. 2005-154835 (Patent Document 1)). Among actual electronic parts, some parts involve a difficulty in carrying out a thermal treatment after fitting and thus, its application may not be possible depending on the type of electronic part. No effective method for such electronic parts has been found yet.

Patent Document 1:
Japanese Patent Laid-Open No. 2005-154835
Patent Document 2:
Japanese Patent Laid-Open No. 2002-317295
Patent Document 3:
Japanese Patent Laid-Open No. Hei 10-102266
Patent Document 4:
Japanese Patent No. 2942476
Patent Document 5:
Japanese Patent Publication No. Sho 56-47955
Patent Document 6:
Japanese Patent Publication No. Sho 56-47956
Patent Document 7:
Japanese Patent Laid-Open No. 2002-53981
Patent Document 8:
Japanese Patent Laid-Open No. Sho 63-285943
Non-Patent-Document 1:
Technical Reports of Mitsubishi Electric Corporation, 1979, vol. 53, No. 11

DISCLOSURE OF THE INVENTION

Problem to be Solved by the Invention

The invention has been made under these circumstances and has for its object the provision of a surface treating method of effectively inhibiting generation of whiskers on a Sn or Sn alloy coating formed on a surface of a substrate to which other member is fixed by pressure welding or on a joint portion to be soldered.

Means for Solving the Problems

The present inventors made intensive studies so as to solve the above problem and, as a result, found that one or two or more of metals selected from Mn, Fe, Ru, Os, Co, Rh, Ir, Ni, Pd, Pt, Cu. Ag, Au, Zn, Cd, Ga, In, Tl, Ge, Pb, Sb and Bi are continuously or discontinuously deposited on a Sn or Sn alloy coating in such a way as to permit part of the Sn or Sn alloy coating to be exposed whereby contact pressure-induced whiskers can be inhibited from being generated in a contact pressure environment such as of the Sn or Sn alloy coating formed on a surface of a substrate to which other member is fixed by pressure welding, that the generation of whiskers can be inhibited without lowering the solder wettability of the Sn or Sn alloy coating without resorting to a thermal treatment or reflowing and that the deposition of such a metal as mentioned above is possible according to a method such as of plating or the like and thus, the generation of whiskers on the Sn or Sn alloy coating can be effectively inhibited by a simple method.

Accordingly, the invention provides the following surface treatment method for the inhibition of whiskers.

[1] A method of surface treatment for the inhibition of whiskers wherein whiskers are inhibited from being generated on a Sn or Sn alloy coating, characterized in that one or two or more of metals selected from Mn, Fe, Ru, Os, Co, Rh, Ir, Ni, Pd, Pt, Cu, Ag, Au, Zn, Cd, Ga, In, Ti, Ge, Pb, Sb and Bi are continuously or discontinuously deposited on a Sn or Sn alloy coating in such a way that part of a surface of the Sn or Sn alloy coating is exposed.

[2] The method as recited in [1], characterized in that an occupying ratio of the metal on the surface of the Sn or Sn alloy coating depositing the metal thereon is not less than 0.02.

[3] The method as recited in [1] or [2], characterized in that the metal is deposited by electroplating.

[4] The method as recited in any one of [1] to [3], characterized in that an average thickness of the deposited metal is not less than 0.01 μm.

[5] The method as recited in [4], characterized in that the average thickness of the deposited metal is not more than 0.6 μm.

[6] The method as recited in any of [1] to [5], characterized in that the Sn or Sn alloy coating is formed on a surface of a substrate to which other member is fixed by pressure welding.

[7] The method as recited in any of [1] to [5], characterized in that the Sn or Sn alloy coating is formed on a joint surface of a substrate to be soldered.

Benefits of the Invention

Since a given type of metal is continuously or discontinuously deposited on the Sn or Sn alloy coating in such a way as to permit part of the Sn or Sn alloy coating surface to be exposed, contact pressure-induced whiskers are inhibited from being generated, and the generation of whiskers can be inhibited without impairing solder wettability unless a thermal treatment or a reflowing treatment is carried out after the metal deposition. Moreover, where the Sn or Sn alloy coating and a deposited metal are alloyed through diffusion at the interface therebetween in the course of storage at room temperature or the like, such a whisker generation inhibiting effect is held.

BEST MODE FOR CARRYING OUT THE INVENTION

Figure 1:
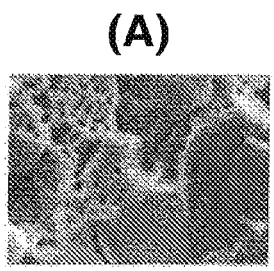
FIG. 1 It shows (A) a SEM image and (B) Sn distribution and Ni distribution measured by EPMA of a Sn coating of Comparative Example 1.
Figure 1:
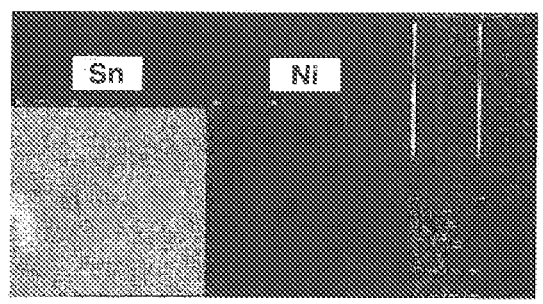
Figure 2:
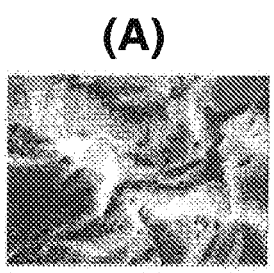
FIG. 2 It shows (A) a SEM image and (B) Sn distribution and Ni distribution measured by EPMA of a Ni-deposited Sn coating of Example 1.
Figure 2:
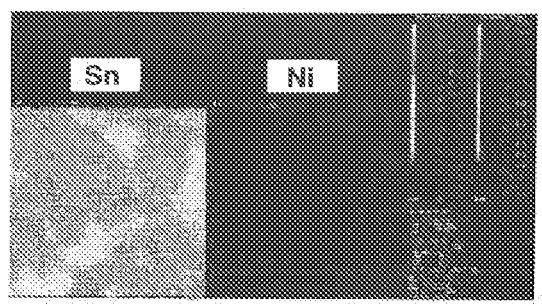
Figure 3:
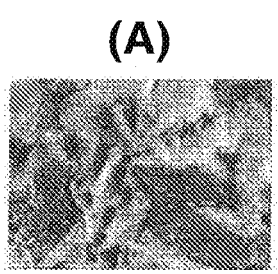
FIG. 3 It shows (A) a SEM image and (B) Sn distribution and Ni distribution measured by EPMA of a Ni-deposited Sn coating of Example 2.
Figure 3:
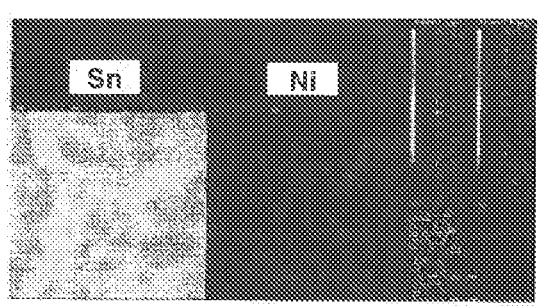
Figure 4:
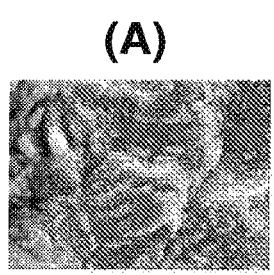
FIG. 4 It shows (A) a SEM image and (B) Sn distribution and Ni distribution measured by EPMA of a Ni-deposited Sn coating of Example 3.
Figure 4:
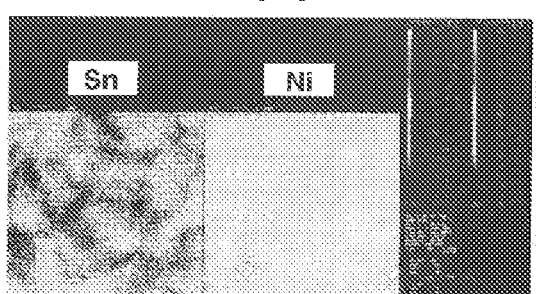
Figure 5:
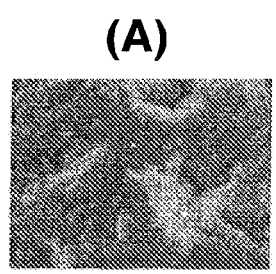
FIG. 5 It shows (A) a SEM image and (B) Sn distribution and Ni distribution measured by EPMA of a Ni-deposited Sn coating of Example 4.
Figure 5:
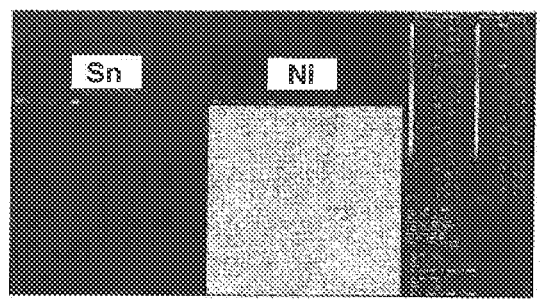
Figure 6:
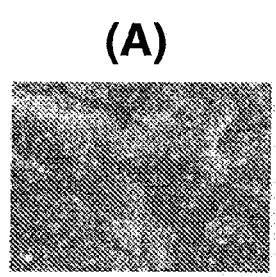
FIG. 6 It shows (A) a SEM image and (B) Sn distribution and Ni distribution measured by EPMA of a Ni-deposited Sn coating of Example 5.
Figure 6:
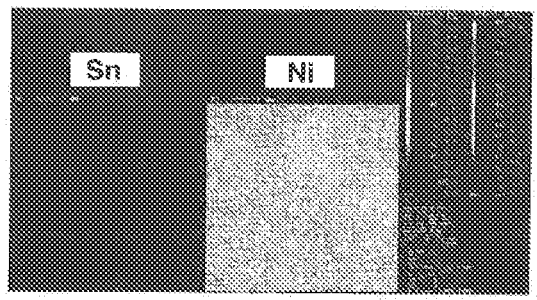

The invention is now described in more detail.

The invention relates to a surface treating method for inhibiting whiskers from being generated on a Sn or Sn alloy coating wherein the surface treatment is carried out by continuously or discontinuously depositing one or two or more of metals (hereinafter referred to as deposited metal) selected from Mn, Fe, Ru, Os, Co, Rh, Ir, Ni, Pd, Pt, Cu, Ag, Au, Zn, Cd, Ga, In, Tl, Ge, Pb, Sb and Bi on the Sn or Sn alloy coating in such a way as to permit part of the Sn or Sn alloy coating surface to be exposed, thereby inhibiting whisker generation.

The surface treating method of the invention can effectively inhibit the generation of whiskers on the Sn or Sn alloy coating that has been formed at a surface of a substrate to which other member is fixed by pressure welding or at a joint portion of the substrate to be soldered. Especially, with the Sn or Sn alloy coating formed on the surface of the substrate to which other member is fixed by pressure welding, the generation of whiskers caused by pressure welding, which is called contact pressure-induced whisker, can be effectively inhibited.

One mechanism of generating whiskers suggests that with a Sn or Sn alloy coating, a thick, uniform oxide film of Sn is continuously formed on the upper layer of the coating. It is considered that if the oxide film has a defect therein, an internal stress caused by alloying between a material (to be plated) and the Sn coating or a stress caused by an external force in fitting parts such as a connector is concentrated at the defect thereby developing a whisker bud and growing into a needle-shaped whisker using the stress as a driving force.

Although not limitative in the practice of the invention, it is considered that the generation of whiskers is inhibited according to the following mechanism. That is, a deposition metal is continuously or discontinuously deposited on the Sn coating or Sn alloy coating thereby causing an oxide film of Sn either not to be formed or to be formed discontinuously. With the discontinuous formation of the Sn oxide film, when defects are great in number, the stress serving as a driving force for the generation of whiskers is dispersed thereby suppressing the generation of whiskers, or leaving whiskers, if generated, as a nodule, not in a needle shape. Hence, it is believed that a short-circuiting trouble caused by whiskers in electronic parts can be prevented.

In the practice of the invention, deposition metals are one or two or more of metals selected from Mn, Fe, Ru, Os, Co, Rh, Ir, Ni, Pd, Pt, Cu, Ag, Au, Zn, Cd, Ga, In, Tl, Ge, Pb, Sb and Bi. The deposition metals should preferably be those metals other than constituent metals for Sn or Sn alloy coatings to be deposited.

It will be noted that in the invention, a state where a deposition metal is discontinuously deposited means a state where the deposition metal is deposited on an Sn coating or Sn alloy coating in the form of islands, for example, like a so-called sea-island structure. On the other hand, a state wherein a deposition metal is deposited continuously means a state where islands of the deposition metal of such a sea-island structure as mentioned above are connected linearly or in meshwork. In either state, the deposition metal exist on the Sn coating or Sn alloy coating uniformly thereover. The Sn coating or Sn alloy coating is not fully covered with the deposition metal but part of the surface of the Sn coating or Sn alloy coating is exposed. For this, in a state where the deposition metal is deposited on the Sn or Sn alloy coating surface as set out above, the observation of surface morphology by SEM or the like reveals a feature of a surface profile state of the Sn coating or Sn alloy coating not deposited with the deposition metal, e.g. a state of a surface profile where the deposition metal is so deposited as to leave an irregular contour of the Sn coating or Sn alloy coating. Moreover, according to a surface composition analysis such as by EPMA (wavelength dispersive X-ray analyzer) or the like, the deposition metal element and Sn element, or the Sn element and metal elements constituting the Sn alloy metals can be both detected in amounts not less than impurity amounts.

In the method of the invention, it is favorable that an occupying ratio of the deposition metal deposited on the Sn or Sn alloy coating surface is not less than 0.02, preferably not less than 0.05. Where the Sn or Sn alloy coating depositing the deposition metal thereon is soldered, it is favorable for the reason of keeping good solder wettability that the occupying ratio of the deposition metal is not more than 18, preferably not more than 15. This occupying ratio can be determined by a peak intensity ratio between the metal element constituting a deposited metal and the metal element constituting the Sn or Sn alloy (metal element constituting the deposited metal/ metal element constituting the Sn or Sn alloy), which is obtained by irradiating an electron beam under conditions of an accelerated voltage of 15 kV and an irradiation current of $1.0 \times 10^{-8}$ A by use of EPMA (wavelength dispersive X-ray analyzer). It will be noted that the characteristic X-ray detected by EPMA can be a K$\alpha$ ray, a L$\alpha$ ray or a M$\alpha$ ray and especially, it is preferred to use a K$\alpha$ ray for Mn, Ni, Co, Fe, Cu, Zn, Ga and Ge, a L$\alpha$ ray for Sn, Pd, Ag, Sb, In, Cd, Rh and Ru, and a M$\alpha$ ray for Bi, Pb, Tl, Au, Pt, Ir and Os.

For a method of depositing a deposition metal on the Sn or Sn alloy coating, a plating method can be adopted, in which a plated deposit containing a deposition metal can be deposited according to a plating using a plating bath containing such a deposition metal as mentioned above, and whichever of electroplating and electroless plating can be adopted, of which electroplating is preferred from the standpoint of ease in controlling such an occupying ratio and thickness of the deposition metal.

Known conditions are applicable to the plating bath and plating conditions used for the deposition of a deposition metal, with which such an occupying ratio and thickness of the deposition metal as set out above may be controlled by appropriate selection of a metal component composition in the plating bath, a plating time, a plating temperature and the like. Especially, simple control is possible by changing the plating time. It is to be noted that a cathode current density in case where electroplating is used is preferably at 0.1 to 5 A/dm$^2$, more preferably at 0.5 to 2 A/dm$^2$.

The average thickness of the deposition metal being deposited (plated deposit) is preferably at 0.01 µm or over, more preferably at 0.02 µm or over and is also preferably at 0.6 µm or below, more preferably at 0.5 µm or below. If the average thickness of the deposition metal being deposited (plated deposit) is less than above range, there is concern that the generation of whiskers cannot be inhibit satisfactorily. Over the above range, especially, where the Sn or Sn alloy coating depositing a deposition metal thereon is soldered, there is concern that good solder wettability cannot be attained. In this connection, it is not necessary to form a deposition metal in thickness greater than required, and the thickness may not be always uniform. It should be noted that the average thickness of the metal being deposited (plated deposit) can be measured by use of a fluorescent X-ray film thickness gauge.

In the invention, an object to be deposited with a deposition metal includes a Sn or Sn alloy coating formed on a surface of a substrate, to which other member is fixed by pressure welding, e.g. a Sn or Sn alloy coating formed on a connector, a Sn or Sn alloy coating formed at a portion to be soldered of a substrate, e.g. a Sn or Sn alloy coating formed on a lead frame, and the like. This Sn or Sn alloy coating is not critical, and any of hitherto known Sn or Sn alloy coatings may be used including, for example, a Sn or Sn alloy-plated coating formed by electroplating.

The method of the invention is effective in inhibiting contact pressure-induced whiskers to be generated on a Sn or Sn alloy coating formed on a surface of a substrate to which other member is fixed by pressure welding, like an Sn or Sn alloy coating formed on fitting parts such as a connector. Moreover, whisker generation can be inhibited without resorting to a thermal treatment or reflowing treatment after plating. Since solder wettability is not degraded depending on the manner of thermal treatment or reflowing treatment after plating, the method is also effectively applied to a Sn or Sn alloy coating formed on a junction portion to be soldered of a substrate, like a Sn or Sn alloy coating formed on a lead frame. Especially, in this case, even if there is used, as a deposition metal, a metal such as Ni, Zn, Fe, Co, Cu, Mn or the like, which is usually considered to be poor in solder wettability, the Sn or Sn alloy coating is not completely covered, so that the solder wettability does not lower significantly, ensuring solder wettability of a satisfactory level in practical application.

After such a given type of metal as set out hereinabove has been continuously or discontinuously deposited on the Sn or Sn alloy coating, the Sn or Sn alloy coating and the deposited metal are diffused at the interface therebetween and alloyed by storage at room temperature or the like, even under which the whisker generation-inhibiting effect is maintained.

EXAMPLES

The invention is particularly described by way of Examples and Comparative Examples, and the invention should not be construed as limited to the following examples.

Examples 1 to 5

A Sn coating (thickness: 7.2 µm) was formed on a Cu material (C1020) by Sn electroplating by use of the following procedure and conditions, followed by Ni electroplating to deposit Ni on the resulting Sn coating.

Treating Step

Electrolytic degreasing (two minutes)→water rinsing (15 seconds)×three times→acid rinsing (20 seconds)→water rinsing (15 seconds)×three times→Sn plating (conditions indicated below)→water rinsing (15 seconds)×three times→Ni plating (conditions indicated below)→water rinsing (15 seconds)×three times→rinsing with ion exchanged water→drying Sn Plating
Plating bath:
Soft Alloy GTC-1T [Sn salt]
 (made by C. Uyemura & Co., Ltd.) 400 g/liter
Soft Alloy GTC-3A [free acid]
 (made by C. Uyemura & Co., Ltd.) 270 g/liter
Soft Alloy GTC-2S [additive]
 (made by C. Uyemura & Co., Ltd.) 200 g/liter
Soft Alloy GTC-33-A [additive]
 (made by C. Uyemura & Co., Ltd.) 130 g/liter
Cathode current density: 5A/dm$^2$
Plating time: 7.5 minutes
Plating temperature: 45° C.
Ni Plating
Plating bath:
Nickel sulfate (heptahydrate) 280 g/liter Nickel chloride (heptahydrate) 40 g/liter
Boric acid 45 g/liter
Cathode current density: 1A/dm$^2$
Plating time: 31 seconds (Examples 1), 2.5 minutes (Example 2), 6.25 minutes (Example 3), 12.5 minutes (Example 4)
Plating temperature: 55° C.
PH: 4.4

The resulting Sn coating deposited with Ni was evaluated by use of an analytical scanning electron microscope JXA-8600MX (made by Jeol Ltd.)-EPMA (wavelength dispersion X-ray analyzer) and a fluorescent X-ray thickness gauge SFT-3400 made by SII NanoTechnology Inc., with respect to an occupying ratio (intensity ratio of Ni/Sn in the analysis by EPMA) and an average thickness of Ni deposition. The results are shown in Table 1, and SEM images and the Ni distribution and Sn distribution measured by means of EPMA are shown in FIGS. 2 to 6. It will be noted that the measuring conditions of EPMA are indicated below.

Measuring Conditions of EPMA
Acceleration voltage: 15 kV
Radiation current: 1.0×10$^{-8}$ A The whisker generation-inhibiting effect and solder wettability were-evaluated according to the following methods. The results are also shown in Table 1.

Evaluation of Whisker Generation Inhibiting Effect
[Evaluation method 1]

A Sn plated coating formed, by Sn plating, on a lead frame made of a C194 material was deposited thereon with Ni by electroplating to provide an evaluation sample. The evaluation sample was allowed to stand at room temperature for 1,000 hours, followed by observation of whiskers by means of a scanning electron microscope (SEM).

[Evaluation Method 2 (Evaluation of Contact Pressure-Induced Whiskers)]

A Sn plated coating formed, by Sn plating, on a 42 alloy material (Fe-42Ni alloy) was deposited thereon with Ni by electroplating to provide an evaluation sample. For a contact pressure loading method, three stainless steel balls (SUS balls) with a diameter of 1 mmϕ were placed in line at a clip port of a clip, under which the evaluation sample was placed in contact with the middle SUS ball and kept under load conditions for five days. After a lapse of five days, the evaluation sample was removed and subjected to observation of whiskers through a scanning electron microscope (SEM).

Evaluation of Solder Wettability
[Evaluation Sample]

A Sn plated coating formed, by Sn plating, on a lead frame made of a C194 material was deposited thereon with Ni by electroplating to provide an evaluation sample.

[Evaluation Conditions]
Accelerated Aging Test Conditions (PCT):
 temperature of 105° C., relative humidity of 100% RH, time of eight hours
Measuring instrument:
 SWET-2100, made by Tarutin Kester Co., Ltd.
Measuring method:
 rapid-heating, temperature-raising method (wetting balance method with solder paste)
Solder paste:
 Sn-3.0 Ag-0.5 wt % Cu (M705-ET7, made by Senju Metal Industry Co., Ltd.)
Heating temperature:
 245° C.

Comparative Example 1

A Sn coating was formed on a Cu material (C1020) by Sn electroplating using the following steps and conditions. The resulting Sn coating was evaluated according to the methods as used in Example 1 with respect to the occupying ratio (intensity ratio of Ni/Sn in the EPMA analysis) and the average thickness of Ni. The results are shown in Table 1, and SEM images and the Ni distribution and Sn distribution measured by EPMA are shown in FIG. 1.

The whisker generation-inhibiting effect and solder wettability were evaluated in the same manner as in Example 1. The results are also shown in Table 1.

Treating Steps

Electrolytic degreasing (two minutes)→water rinsing (15 seconds)×three times→acid rinsing (20 seconds)→water rinsing (15 seconds)×three times→Sn plating (same as in Example 1)→water rinsing (15 seconds)×three times→rinsing with ion exchanged water→drying

TABLE 1

| | Relative intensity (Ni/Sn intensity ratio) | Ni thickness (μm) | Whisker generation inhibiting effect | | Solder wettability |
|---|---|---|---|---|---|
| | | | Evaluation 1 | Evaluation 2 | |
| Comparative Example 1 | Trace | 0 | X | X | ○ |
| Example 1 | 0.05 | 0.02 | ○ | ○ | ○ |
| Example 2 | 0.15 | 0.06 | ○ | ○ | ○ |
| Example 3 | 1.8 | 0.19 | ○ | ○ | ○ |
| Example 4 | 15.0 | 0.5 | ○ | ○ | ○ |
| Example 5 | 130.8 | 1.06 | ○ | ○ | X |

Evaluation of Whisker Generation Inhibiting Effect
○: Zero in number of generated whiskers
Δ: Whiskers observed, with a length thereof being less than 10 μm.
X: Whiskers observed, with a length thereof being not less than 10 μm.

Evaluation of Solder Wettability
○: Zero cross time shorter than 3 seconds.
X: Zero cross time not shorter than 3 seconds.

On comparing FIGS. 1(A) to 6(A), it will be seen that each of the surface states observed through SEM which are shown in FIGS. 2(A) to 6(A) of Examples 1 to 5 being deposited with the deposition metal has a profile of the surface state which is shown in FIG. 1(A) of Comparative Example 1 being not deposited with a deposition metal.

Examples 6 to 23, Comparative Examples 2 to 6

The following Sn or Sn alloy coatings including:
Sn plated coating (coating thickness: 10 μm);
Sn—Cu alloy plated coating (Cu content in the coating: 1.6 wt %, coating thickness: 10 μm);
Sn—Bi alloy plated coating (Bi content in the coating: 1.9 wt %, coating thickness: 10 μm);
Sn—Ag alloy plated coating (Ag content in the coating: 3.5 wt %, coating thickness: 10 μm);
Sn—Pb alloy plated coating (Pb content in the coating: 0.05 wt %, coating thickness: 10 μm);
Sn—Ni alloy plated coating (Ni content in the coating: 4 wt %, coating thickness: 10 μm);
Sn—Zn alloy plated coating (Zn content in the coating: 3 wt %, coating thickness: 10 μm);
Sn—In alloy plated coating (In content in the coating: 1.5 wt %, coating thickness: 10 μm); and
Sn—Co alloy plated coating (Co content in the coating: 2.2 wt %, coating thickness: 10 μm), were deposited with Ag, Bi, Pb, In, Ni, Cu, Au, Co or Pd by electroplating using plating baths indicated in Table 2 to evaluate whisker and solder wettability. The occupying ratio and thickness of Ag, Bi, Pb, In, Ni, Cu, Au, Co or Pd on the surface of the Sn or Sn alloy coatings were evaluated in the same manner as in Example 1. The results are shown in Table 3. It will be noted that the plating compositions and conditions for the deposition of Ag, Bi, Pb, In, Ni, Cu, Au, Co or Pd, and the evaluation methods of whisker and solder wettability are as described below.

TABLE 2

| Deposition metal | Composition | | Current density | Bath temperature | pH |
|---|---|---|---|---|---|
| Ag | Silver cyanide | 30 g/L | 1 A/dm² | 25° C. | |
| | Potassium cyanide | 35 g/L | | | |
| | Potassium carbonate | 30 g/L | | | |
| Bi | Bismuth sulfate | 25 g/L | 1 A/dm² | 25° C. | |
| | Methanesulfonic acid | 200 g/L | | | |
| | Polyethylene glycol nonylphenyl ether | 10 g/L | | | |
| Pb | Lead borofluoride | 100 g/L | 1 A/dm² | 30° C. | |
| | Borohydrofluoric acid | 60 g/L | | | |
| | Boric acid | 20 g/L | | | |
| | Gelatin | 0.2 g/L | | | |
| In | Indium sulfate | 100 g/L | 1 A/dm² | 30° C. | pH 2 |
| | Sodium sulfamate | 150 g/L | | | |
| | Sulfamic acid | 25 g/L | | | |
| | Sodium chloride | 45 g/L | | | |
| | Dextrose | 8 g/L | | | |
| | Triethanolamine | 2.5 g/L | | | |
| Ni | Nickel sulfate (hexahydrate) | 280 g/L | 1 A/dm² | 55° C. | pH 4.4 |
| | Nickel chloride (hexahydrate) | 40 g/L | | | |
| | Boric acid | 45 g/L | | | |
| Cu | Copper cyanide | 25 g/L | 0.5 A/dm² | 35° C. | |
| | Sodium cyanide | 40 g/L | | | |
| Au | Potassium gold cyanide | 5 g/L | 0.5 A/dm² | 35° C. | pH 4.5 |
| | Citric acid | 50 g/L | | | |
| | Potassium citrate | 70 g/L | | | |
| Co | Cobalt sulfate (heptahydrate) | 500 g/L | 3 A/dm² | 30° C. | pH 3.5 |
| | Sodium chloride | 15 g/L | | | |
| | Boric acid | 45 g/L | | | |
| Pd | Palladium diaminohyponitrite | 13 g/L | 0.5 A/dm² | 30° C. | pH 8 |
| | Ammonium sulfamate | 100 g/L | | | |

Evaluation of Whisker
[Evaluation Method 1]

A Sn or Sn alloy-plated coating formed on a lead frame made of a C194 material by Sn or Sn alloy plating was deposited thereon with Ag, Bi, Pb, In, Ni, Cu, Au, Co or Pd by electroplating to provide evaluation samples. The evaluation samples were allowed to stand at room temperature for 1,000 hours, followed by observation of whiskers by means of a scanning electron microscope (SEM).

[Evaluation Method 2 (Evaluation of Contact Pressure-Induced Whisker)]

A Sn or Sn alloy plated coating formed, by Sn or Sn alloy plating, on a 42 alloy material (Fe-42Ni alloy) was deposited thereon with Ag, Bi, Pb, In, Ni, Cu, Au, Co or Pd by electroplating to provide evaluation samples. For a contact pressure-loading method, three stainless steel balls (SUS balls) with a diameter of 1 mmϕ were placed in line at a clip port of a clip, under which the evaluation sample was placed in contact with the middle SUS ball and kept under load conditions for five days. After a lapse of five days, the evaluation sample was removed and subjected to observation of whiskers through a scanning electron microscope (SEM).

Evaluation of Solder Wettability
[Evaluation Sample]

A Sn or Sn alloy plated coating formed, by Sn or Sn alloy plating, on a lead frame made of a C194 material was deposited thereon with Ag, Bi, Pb, In, Ni, Cu, Au, Co or Pd by electroplating to provide evaluation samples.

[Evaluation Conditions]
Accelerated aging test conditions (PCT):
    temperature of 105° C., relative humidity of 100% RH, time of eight hours
Measuring instrument:
    SWET-2100, made by Tarutin Kester Co., Ltd.
Measuring method:
    rapid-heating, temperature-raising method (wetting balance method with solder paste)
Solder paste:
    Sn-3.0 Ag-0.5 wt % Cu (M705-ET7, made by Senju Metal Industry Co., Ltd.)
Heating temperature:
    245° C.

TABLE 3

| | Example | | | | | | | |
|---|---|---|---|---|---|---|---|---|
| | 6 | 7 | 8 | 9 | 10 | 11 | 12 | 13 |
| Sn or Sn alloy plated coating | Sn | Sn | Sn—Cu | Sn—Cu | Sn—Bi | Sn—Bi | Sn—Ag | Sn—Ag |
| Deposition metal | Ag | Ni | Bi | Pb | Pd | Cu | In | Co |
| Occupying ratio of deposition metal | 0.13 | 0.05 | 1.9 | 0.02 | 0.15 | 1.8 | 13.0 | 0.13 |

TABLE 3-continued

| | | | | | | | | |
|---|---|---|---|---|---|---|---|---|
| Thickness of deposition metal (μm) | 0.05 | 0.02 | 0.2 | 0.01 | 0.06 | 0.19 | 0.47 | 0.05 |
| Evaluation of whisker — Evaluation method 1 | ○ | ○ | ○ | ○ | ○ | ○ | ○ | ○ |
| Evaluation of whisker — Evaluation method 2 | ○ | ○ | ○ | ○ | ○ | ○ | ○ | ○ |
| Evaluation of solder wettability | ○ | ○ | ○ | ○ | ○ | ○ | ○ | ○ |

| | Example | | | | | | | |
|---|---|---|---|---|---|---|---|---|
| | 14 | 15 | 16 | 17 | 18 | 19 | 20 | 21 |
| Sn or Sn alloy plated coating | Sn—Pb | Sn—Pb | Sn—Ni | Sn—Ni | Sn—Zn | Sn—Zn | Sn—In | Sn—In |
| Deposition metal | Ni | In | Au | Bi | Ag | Co | Pb | Pd |
| Occupying ratio of deposition metal | 1.8 | 15.0 | 0.05 | 1.9 | 0.02 | 0.15 | 13.0 | 1.8 |
| Thickness of deposition metal (μm) | 0.19 | 0.5 | 0.02 | 0.2 | 0.01 | 0.06 | 0.47 | 0.19 |
| Evaluation of whisker — Evaluation method 1 | ○ | ○ | ○ | ○ | ○ | ○ | ○ | ○ |
| Evaluation of whisker — Evaluation method 2 | ○ | ○ | ○ | ○ | ○ | ○ | ○ | ○ |
| Evaluation of solder wettability | ○ | ○ | ○ | ○ | ○ | ○ | ○ | ○ |

| | Example | | Comparative Example | | | | |
|---|---|---|---|---|---|---|---|
| | 22 | 23 | 2 | 3 | 4 | 5 | 6 |
| Sn or Sn alloy plated coating | Sn—Co | Sn—Co | Sn | Sn—Cu | Sn—Bi | Sn—Ag | Sn—Pb |
| Deposition metal | Ni | Cu | Ni | Bi | Ag | Co | Cu |
| Occupying ratio of deposition metal | 0.05 | 0.13 | 118 | 130 | 118 | 127 | 123 |
| Thickness of deposition metal (μm) | 0.02 | 0.05 | 1.0 | 1.06 | 1.0 | 1.04 | 1.02 |
| Evaluation of whisker — Evaluation method 1 | ○ | ○ | ○ | ○ | ○ | ○ | ○ |
| Evaluation of whisker — Evaluation method 2 | ○ | ○ | ○ | ○ | ○ | ○ | ○ |
| Evaluation of solder wettability | ○ | ○ | X | X | X | X | X |

Evaluation of Whisker
○: Zero in number of generated whiskers
Δ: Whiskers observed, with a length thereof being less than 10 μm.
X: Whiskers observed, with a length thereof being not less than 10 μm.
Evaluation of Solder Wettability
○: Zero cross time shorter than three seconds.
X: Zero cross time not shorter than three seconds.

Examples 24 to 41, Comparative Examples 7 to 11

The Sn or Sn alloy coatings indicated below:
Sn-plated coating (thickness: 2 μm);
Sn—Cu alloy plated coating (Cu content in the coating: 1.6 wt %, thickness: 2 μm);
Sn—Bi alloy plated coating (Bi content in the coating: 1.9 wt %, thickness: 2 μm);
Sn—Ag alloy plated coating (Ag content in the coating: 3.5 wt %, thickness: 2 μm);
Sn—Pb alloy plated coating (Pb content in the coating: 0.05 wt %, thickness: 2 μm);
Sn—Ni alloy plated coating (Ni content in the coating: 4 wt %, thickness: 2 μm);
Sn—Zn alloy plated coating (Zn content in the coating: 3 wt %, thickness: 2 μm);
Sn—In alloy plated coating (In content in the coating: 1.5 wt %, thickness: 2 μm); and
Sn—Co alloy plated coating (Co content in the coating: 2.2 wt %, thickness: 2 μm)
were deposited thereon with Ag, Bi, Pb, In, Ni, Cu, Au, Co or Pd by electroplating using plating baths indicated in Table 2 to evaluate whisker and solder wettability. The occupying ratio and thickness of the deposited Ag, Bi, Pb, In, Ni, Cu, Au, Co or Pd on the surface of the Sn or Sn alloy coatings were evaluated in the same manner as in Example 1. The results are shown in Table 4. It will be noted that the plating compositions and conditions for the deposition of Ag, Bi, Pb, In, Ni, Cu, Au, Co or Pd, and the evaluation methods of whisker and solder wettability are as described below.

Evaluation of Whisker
[Evaluation Method 1]
A underling Ni plated coating was formed on a connector (material: brass) in an average thickness of 1.5 μm, on which a Sn or Sn alloy plated coating was formed by Sn or Sn alloy plating, followed by deposition of Ag, Bi, Pb, In, Ni, Cu, Au, Co or Pd by electroplating to provide evaluation samples. The evaluation samples were allowed to stand at room temperature for 1,000 hours and whiskers were observed through a scanning electron microscope (SEM).
[Evaluation Method 2 (Evaluation of Contact Pressure-Induced Whisker)]
A Sn or Sn alloy plated coating formed, by Sn or Sn alloy plating, on a 42 alloy material (Fe-42Ni alloy) was deposited thereon with Ag, Bi, Pb, In, Ni, Cu, Au, Co or Pd by electroplating to provide evaluation samples. For a contact pressure loading method, three stainless steel balls (SUS balls) with a diameter of 1 mmφ were placed in line at a clip port of a clip, under which the evaluation sample was placed in contact with the middle SUS ball and kept under load conditions for five days. After a lapse of five days, the evaluation sample was removed and subjected to observation of whiskers through a scanning electron microscope (SEM).
Evaluation of Solder Wettability
[Evaluation Sample]
An underling Ni plated coating was formed on a connector (material: brass) in an average thickness of 1.5 μM, on which a Sn or Sn alloy coating was formed by Sn or Sn alloy plating and was deposited thereon with Ag, Bi, Pb, In, Ni, Cu, Au, Co or Pd by electroplating to provide evaluation samples.

[Evaluation Conditions]

Accelerated aging test conditions (PCT):
 temperature of 105° C., relative humidity of 100% RH, time of eight hours Measuring instrument:
 SWET-2100, made by Tarutin Kester Co., Ltd.

Measuring method:
 wetting balance method

Solder paste:
 Sn-3.0 Ag-0.5 wt % Cu (M705-ET7, made by Senju Metal Industry Co., Ltd.)

Flux:
 NA-200, made by Tamura Kaken Corporation

Heating temperature:
 245° C.

Comparative Examples 12 to 20

With respect to the Sn or Sn alloy coatings indicated below:
Sn-plated coating (thickness: 10 μm);
Sn—Cu alloy plated coating (Cu content in the coating: 1.6 wt %, thickness: 10 μm);
Sn—Bi alloy plated coating (Bi content in the coating: 1.9 wt %, thickness: 10 μm);
Sn—Ag alloy plated coating (Ag content in the coating: 3.5 wt %, thickness: 10 μm);
Sn—Pb alloy plated coating (Pb content in the coating: 0.05 wt %, thickness: 10 μm);
Sn—Ni alloy plated coating (Ni content in the coating: 4 wt %, thickness: 10 μm);
Sn—Zn alloy plated coating (Zn content in the coating: 3 wt %, thickness: 10 μm);

TABLE 3

| | Example | | | | | | | |
|---|---|---|---|---|---|---|---|---|
| | 24 | 25 | 26 | 27 | 28 | 29 | 30 | 31 |
| Sn or Sn alloy plated coating | Sn | Sn | Sn—Cu | Sn—Cu | Sn—Bi | Sn—Bi | Sn—Ag | Sn—Ag |
| Deposition metal | Bi | Co | Pb | Au | In | Pd | Cu | Ni |
| Occupying ratio of deposition metal | 1.9 | 0.13 | 0.02 | 0.05 | 13.0 | 0.13 | 1.8 | 0.15 |
| Thickness of deposition metal (μm) | 0.2 | 0.05 | 0.01 | 0.02 | 0.47 | 0.05 | 0.19 | 0.06 |
| Evaluation of whisker Evaluation method 1 | ◯ | ◯ | ◯ | ◯ | ◯ | ◯ | ◯ | ◯ |
| Evaluation method 2 | ◯ | ◯ | ◯ | ◯ | ◯ | ◯ | ◯ | ◯ |
| Evaluation of solder wettability | ◯ | ◯ | ◯ | ◯ | ◯ | ◯ | ◯ | ◯ |

| | Example | | | | | | | |
|---|---|---|---|---|---|---|---|---|
| | 32 | 33 | 34 | 35 | 36 | 37 | 38 | 39 |
| Sn or Sn alloy plated coating | Sn—Pb | Sn—Pb | Sn—Ni | Sn—Ni | Sn—Zn | Sn—Zn | Sn—In | Sn—In |
| Deposition metal | Ag | Cu | In | Pb | Pd | Co | Bi | Ni |
| Occupying ratio of deposition metal | 0.13 | 1.9 | 0.13 | 15.0 | 0.13 | 0.13 | 1.9 | 0.15 |
| Thickness of deposition metal (μm) | 0.05 | 0.2 | 0.05 | 0.5 | 0.05 | 0.05 | 0.2 | 0.06 |
| Evaluation of whisker Evaluation method 1 | ◯ | ◯ | ◯ | ◯ | ◯ | ◯ | ◯ | ◯ |
| Evaluation method 2 | ◯ | ◯ | ◯ | ◯ | ◯ | ◯ | ◯ | ◯ |
| Evaluation of solder wettability | ◯ | ◯ | ◯ | ◯ | ◯ | ◯ | ◯ | ◯ |

| | Example | | Comparative Example | | | | |
|---|---|---|---|---|---|---|---|
| | 40 | 41 | 7 | 8 | 9 | 10 | 11 |
| Sn or Sn alloy plated coating | Sn—Co | Sn—Co | Sn | Sn—Cu | Sn—Bi | Sn—Ag | Sn—Pb |
| Deposition metal | Au | Ag | Co | Ni | Cu | Bi | Ag |
| Occupying ratio of deposition metal | 0.02 | 0.05 | 138 | 119 | 128 | 127 | 123 |
| Thickness of deposition metal (μm) | 0.01 | 0.02 | 1.1 | 1.0 | 1.05 | 1.04 | 1.02 |
| Evaluation of whisker Evaluation method 1 | ◯ | ◯ | ◯ | ◯ | ◯ | ◯ | ◯ |
| Evaluation method 2 | ◯ | ◯ | ◯ | ◯ | ◯ | ◯ | ◯ |
| Evaluation of solder wettability | ◯ | ◯ | X | X | X | X | X |

Evaluation of Whisker

◯: Zero in number of generated whisker

Δ: Whiskers observed, with a length thereof being less than 10 μm.

X: Whiskers observed, with a length thereof being not less than 10 μm.

Evaluation of Solder Wettability

◯: Zero cross time is shorter than three seconds.

X: Zero cross time is not shorter than three seconds.

Sn—In alloy plated coating (In content in the coating: 1.5 wt %, thickness: 10 μm); and
Sn—Co alloy plated coating (Co content in the coating: 2.2 wt %, thickness: 10 μm),
whisker and solder wettability were evaluated. The results are shown in Table 5. It will be noted that the evaluation methods of whisker and solder wettability are as described below.

Evaluation of Whisker

[Evaluation Method 1]

A lead frame made of a C194 material on which a Sn or Sn alloy plated coating was formed by Sn or Sn alloy plating was provided as an evaluation sample. Two samples including an evaluation sample that was allowed to stand at room temperature for 1,000 hours (not thermally treated) and an evaluation sample that was thermally treated at 150° C. for one hour within three hours after the formation of the plated coating were subjected to observation of whiskers through a scanning electron microscope (SEM).

[Evaluation Method 2 (Evaluation of Contact Pressure-Induced Whisker)]

A 42 alloy material (Fe-42Ni alloy) on which a Sn or Sn alloy plated coating was formed by Sn or Sn alloy plating was provided as an evaluation sample. Two samples including an evaluation sample used in its integrity (not thermally treated) and an evaluation sample that was thermally treated at 150° C. for one hour within three hours after the formation of the plated coating (thermally treated) were evaluated. For a contact pressure loading method, three stainless steel balls (SUS balls) with a diameter of 1 mmφ were placed in line at a clip port of a clip, under which each evaluation sample was placed in contact with the middle SUS ball and kept under load conditions for five days. After a lapse of five days, the evaluation sample was removed and subjected to observation of whiskers through a scanning electron microscope (SEM).

Evaluation of Solder Wettability

[Evaluation Sample]

A lead frame made of a C194 material on which a Sn or Sn alloy plated coating by Sn or Sn alloy plating was provided as an evaluation sample.

[Evaluation Conditions]

Accelerated aging test conditions (PCT):
 temperature of 105° C., relative humidity of 100% RH, time of eight hours Measuring instrument:
 SWET-2100, made by Tarutin Kester Co., Ltd.

Measuring method:
 rapid heating, temperature raising method (wetting balance method with solder paste)

Solder paste:
 Sn-3.0 Ag-0.5 wt % Cu (M705-ET7, made by Senju Metal Industry Co., Ltd.)

Heating temperature:
 245° C.

Evaluation of Solder Wettability

○: Zero cross time is shorter than three seconds.

X: Zero cross time is not shorter than three seconds.

The invention claimed is:

1. A method of surface treatment for the inhibition of contact pressure-induced whiskers comprising depositing one or two or more of metals selected from Mn, Fe, Os, Co, Ni, Au, Zn, Cd, Ga, In, Tl, Ge, Pb, and Sb on a Sn or Sn alloy,
 wherein
 the one or two or more metals are deposited on the Sn or Sn alloy coating in the form of a sea-islands structure,
 the sea is the Sn or Sn alloy coating and the islands are the deposited metal, and wherein the Sn coating or Sn alloy coating is not fully covered with the deposition metal but a part of a surface of the Sn coating or Sn alloy coating is exposed,
 an average thickness of the deposited metal is 0.01-0.5 μm, and
 an occupying ratio of said metal on the surface of said Sn or Sn alloy coating depositing said metal thereon is 0.02 to 15,
 wherein contact pressure-induced whiskers are inhibited from being generated on said Sn or Sn alloy coating.

2. The method according to claim 1, characterized in that wherein said metal is deposited by electroplating.

3. The method according to claim 1, wherein said Sn or Sn alloy coating is formed on a surface of a substrate to which other member is fixed by pressure welding.

4. The method according to claim 1, wherein said Sn or Sn alloy coating is formed on a joint surface of a substrate to be soldered.

5. The method according to claim 1, wherein the islands of the deposited metal are connected linearly or in a meshwork structure.

6. The method according to claim 1, wherein the islands of the deposited metal are connected linearly.

TABLE 5

| | | | Comparative Example | | | | | | | | |
|---|---|---|---|---|---|---|---|---|---|---|---|
| | | | 12 | 13 | 14 | 15 | 16 | 17 | 18 | 19 | 20 |
| Sn or Sn alloy plated coating | | | Sn | Sn—Cu | Sn—Bi | Sn—Ag | Sn—Pb | Sn—Ni | Sn—Zn | Sn—In | Sn—Co |
| Evaluation of whisker | Evaluation method 1 | Not thermally treated | X | X | X | X | X | X | X | X | X |
| | | Thermally treated | ○ | ○ | ○ | ○ | ○ | ○ | ○ | ○ | ○ |
| | Evaluation method 2 | Not thermally treated | X | X | X | X | X | X | X | X | X |
| | | Thermally treated | X | X | X | X | X | X | X | X | X |
| Evaluation of solder wettability | | | ○ | ○ | ○ | ○ | ○ | ○ | ○ | ○ | ○ |

Evaluation of Whisker

○: Zero in number of generated whisker

Δ: Whiskers observed, with a length thereof being less than 10 μm.

X: Whiskers observed, with a length thereof being not less than 10 am.

7. The method according to claim 1, wherein the islands of the deposited metal are connected in a meshwork structure.

8. The method according to claim 1, comprising continuously or discontinuously depositing one or two or more of metals consisting of Mn, Fe, Os, Co, Ni, Au, Zn, Cd, Ga, In, Tl, Ge, Pb or Sb on a Sn or Sn alloy coating.

* * * * *